United States Patent [19]
Schwarz

[11] Patent Number: 5,835,429
[45] Date of Patent: Nov. 10, 1998

[54] DATA RETENTION WEAK WRITE CIRCUIT AND METHOD OF USING SAME

[75] Inventor: William Schwarz, San Leandro, Calif.

[73] Assignee: LSI Logic Corporation, Milpitas, Calif.

[21] Appl. No.: 854,076

[22] Filed: May 9, 1997

[51] Int. Cl.[6] .............................. G11C 7/00; G11C 11/00
[52] U.S. Cl. ......................... 365/201; 365/154; 365/156; 365/200
[58] Field of Search .................................... 365/200, 201, 365/154, 156, 230.06; 371/21.1

[56] References Cited

U.S. PATENT DOCUMENTS

| | | | |
|---|---|---|---|
| 5,222,066 | 6/1993 | Grula et al. | 371/21.1 |
| 5,491,665 | 2/1996 | Sachdev | 365/201 |
| 5,495,448 | 2/1996 | Sachdev | 365/201 |
| 5,559,745 | 9/1996 | Banik et al. | 365/201 |
| 5,577,050 | 11/1996 | Bair et al. | 365/201 |
| 5,642,318 | 6/1997 | Knaack et al. | 365/201 |

OTHER PUBLICATIONS

Rob Dekker, et al., "A Realistic Fault Model and Test Algorithms for Static Random Access Memories," IEEE Transactions on Computer–Aided Design, vol. 9, No. 6, Jun. 1990, pp. 567–572.

Rochit Rajsuman, "An Algorithm and Design to Test Random Access Memories," 1992 IEEE International Symposium on Circuits and Systems, vol. 1 of 6, pp. 439–442, May 1992.

Manjov Sachdev, "Reducing the CMOS RAM Test Complexity with $I_{DDQ}$ and Voltage Testing," Journal of Electronic Testing: Theory and Appls., 6, 191–202 (1995).

Clinton Kuo, et al., "Soft–Defect Detection (SDD) Technique for a High–Reliability CMOS SRAM," IEEE Journal of Solid–State Circuits, vol. 25, No. 1, Feb. 1990, pp. 61–67.

M. Bohr, et al., "A High Performance 0.35 $\mu$m Logic Technology for 3.3V and 2.5V Operation," International Electron Devices Meeting, pp. 273–276, Dec. 1994.

A.J. van de Goor, "Testing Semiconductor Memories—Theory and Practice," chaps. 4, 7–11. John Wiley & Sons, West Sussex, England, 1991.

Meixner and Banik, "Weak Write Test Mode: An SRAM Cell Stability Design for Test Technique," IEEE Int'l Test Conference (1996).

Primary Examiner—David C. Nelms
Assistant Examiner—Trong Phan

[57] ABSTRACT

A test circuit is provided for detection of data retention faults and cell stability faults of a memory array, such as a static random access memory (SRAM). The memory array test circuit comprises a weak write test circuit, a memory array address decoder, a microprocessor and display unit. During testing of the memory array, the weak test circuit controls the address decoder to decrease the voltage on the word lines so that it is less than the threshold voltage of the memory array transistors. The microprocessor then writes an inverted data to the memory array and then reads it. The read inverted data is sent to the display unit for comparison with a known template. By comparing the read inverted data to the template, defective memory cells can be identified.

10 Claims, 2 Drawing Sheets

DATA RETENTION WEAK WRITE CIRCUIT AND METHOD OF USING SAME

TECHNICAL FIELD

This invention relates in general to a method and testing circuit for memory arrays, and the invention more particularly relates to a memory testing system for determining data retention faults in large static memory arrays.

BACKGROUND ART

There have been various circuits and different techniques for testing large static CMOS memory arrays for data retention faults and cell stability faults. For example, reference may be made to the following publications, each of which is incorporated herein as though fully setforth: Meixner, Anne et al. "Weak Write Test Mode: An SRAM Cell Stability Design for Test Technique," Paper 11.2, 1996 IEEE International Test Conference; van de Goor, A. J. "Testing Semiconductor Memories: Theory and Practice," John Wiley & Sons, West Sussex England, 1991; Dekker, R. et al. "A Realistic Fault Model and Test Algorithms for Static Random Access Memories," IEEE Transactions on Computer, C-9 (6) 1990 pages 567–572; Rajsuman, Rochit; "An Algorithm and Design to Test Random Access Memories," IEEE International Symposium on Circuit and Systems, 1992, pages 439–442; Sachdev, Manoj: "Reducing the CMOS RAM Test Complexity with IDDQ and Voltage Testing," Journal of Electronic Testing: Theory and Applications, Vol. 5, 1995, pages 191–202; Kuo, Clinton; et al. "Soft-Defect Detection (SDD) Technique for a High-Reliability CMOS SRAM," IEEE Journal of Solid-State Circuits, Vol. 25 No. 1 February 1990, pages 61–67; Bohr, Mark et al. "A High Performance 0.3 micrometer Logic Technology for 3.3 V and 2.5 V Operation," IDEM, December 1994, pages 10.2.1–10.2.4; and the following United States patent documents:

As disclosed in the foregoing mentioned documents, various testing methods and circuits have been utilized for testing of large static CMOS memory arrays for data retention faults and cell stability faults.

While such methods and circuits may have been satisfactory for some applications, the detection of data retention faults and cell stability in SRAM memory arrays has been a time consuming process. In this regard, the standard method of detecting cell defects is through data retention testing where the memory array power supply voltage is dropped allowing the memory array to advance to a standby mode. While the memory array is in the standby mode, the amount of current that is able to flow into a memory cell is sufficiently decreased that defective cells are not able to replenish the charge lost due to leakage. In short, the cell will no longer be able to hold data.

After a sufficient pause to allow the leakage to take effect in the defective cells, the memory power supply voltage is restored to its nominal value and the memory array output is read for the purpose of determining whether any cell data has been flipped from its previous setting.

While this method may detect defective cells, the majority of the testing time is consumed in waiting for the charge in each cell to drain. This pause or wait time period is generally a considerable period of time, hence data retention testing results in a dramatic increase in costs.

Another problem with data retention testing is associated with the uncertainty in determining the exact amount of time that must be passed to result in current drainage. In this regard, the parameters such as the pause time and the value of the data retention voltage must be determined empirically. Such empirical values can vary from technology to technology and even from lot to lot. Testing screens that are effective for one lot of devices may well be ineffective for another lot of devices, resulting in the unnecessary rejection of good parts as well as allowing certain defective cells escaping detection.

Therefore it would be highly desirable to have a new and improved testing method and circuit for testing large static CMOS memory arrays for data retention faults than is fast and efficient and that does not involve empirical calculations that can result in different screen test results.

One attempt at solving the above -mentioned problem, has been proposed in the Meixner paper. In the Meixner disclosure a weak write circuit and method are proposed. More particularly, with this method, weak or marginal cells are overwritten with a weak write, while good cells are unaffected. To accomplish overwriting a rather complex and expensive weak write circuit is utilized for each column of cells in the memory array. This weak write circuit has a reduced current drive capability during a write cycle and thus, can only overwrite a marginal cell.

Therefore it would be highly desirable to have a new and improved testing method and circuit for testing large static CMOS memory arrays, that is reliable with improved detection capabilities and that is relatively inexpensive while greatly improving production throughput with shorter test times.

DISCLOSURE OF INVENTION

Therefore the principal object of the present invention is to provide a new and improved testing method and circuit for testing large static CMOS memory arrays for data retention faults in a fast and efficient manner, wherein the testing circuit is relatively inexpensive to manufacture.

Briefly, the above and further objects of the present invention are realized by providing a new and improved a static memory array test circuit for detecting data retention faults in a large static CMOS memory array in a fast and efficient manner according to the novel testing method of the present invention.

The memory test circuit includes a weak write test circuit which is coupled to a memory array address decoder that controls the word lines of the CMOS memory array under test. The weak write test circuit, during a weak write cycle causes the power supply voltage to the address decoder to sufficiently decreased so that the voltage on the word lines to the memory array is less than the threshold voltage of the word line transistors so that data line information to the memory array will be inefficiently coupled into the cell. Thus, in a weak cell, the data will be flipped, while in a good cell the data will remain stable and unchanged.

The weak-write algorithm involves writing a pattern of data to the memory array utilizing a normal write cycle. The pattern is then read back from the memory array and compared with a pattern template for accuracy. Next an inverse pattern is written to the memory array using a weak write cycle where the voltage to the address decoder is sufficiently lowered to so the inverse data is inefficiently coupled into the cells of the memory array. The original pattern is again read from the memory array allowing the detection of any cell with flipped data resulting from the weak-write cycle. This process is then repeated using inverted data for the initial write cycle, followed by a weak-write cycle with inverse data. In this manner, the weak-write algorithm can verify that all cells in the memory array can hold two state binary information.

For an even more thorough and meticulous testing procedure, the write patterns can be varied for example from zeros, to ones, to checker boards.

BRIEF DESCRIPTION OF DRAWINGS

The above-mentioned and other objects and features of this invention and the manner of attaining them will become apparent, and the invention itself will be best understood by reference to the following description of an embodiment of the invention taken in conjunction with the accompanying drawings, wherein.

BEST MODE FOR CARRYING OUT THE INVENTION

Figure 1:
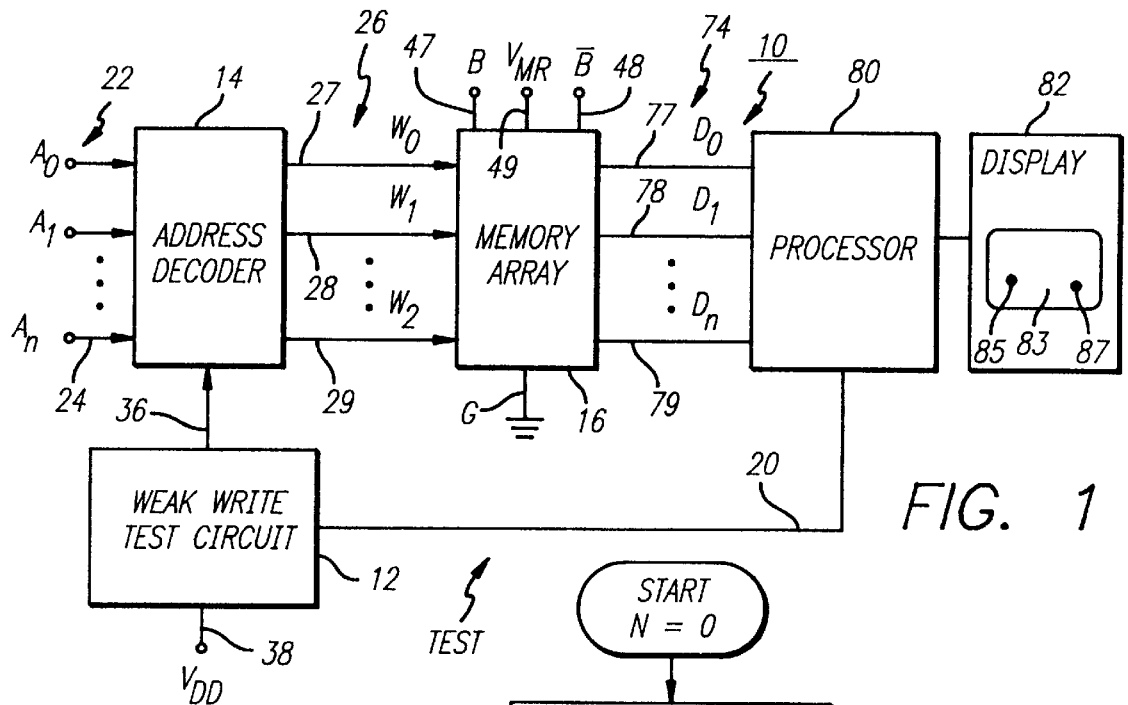
FIG. 1 is a system block diagram of a large static memory array tester, which is constructed in accordance with the present invention.

Referring now to the drawings, and more particularly to FIG. 1 thereof, there is shown a CMOS memory array testing system 10, which is constructed in accordance with the present invention. The system 10 can be readily utilized for testing large static CMOS memory arrays for data retention faults and cell stability faults in a fast and efficient manner in accordance with the testing method of the present invention.

The system 10 generally comprises a microprocessor 80 which communicates with a weak-write test circuit 12 and an address decoder unit 14 for causing various test patterns to be written into a large static CMOS memory array unit 16 for the detection of cell stability and data retention faults. The address decoder 14 is coupled between the weak write test circuit 12 and the memory array 16 for addressing the memory array 16 during a normal write operation and a weak-write operation. In this regard, the address decoder 14 responds to address informnation 22 generated by the microprocessor 80 and generates a group 26 of word line signals $W_{0-n}$, such as the word line signals 27–29 respectively. During a normal write cycle the word line signals 27–29 are at their nominal voltage value to enable test pattern data generated by the microprocessor 80 to be coupled into the memory cells of the memory array 16 via a set of data lines 47 and 48 respectively. More particularly, as will be explained hereinafter in greater detail, the weak write circuit 12 causes an address decoder voltage line 36 to be maintained at a nominal voltage level during the normal write cycle so that data can be efficiently coupled into the memory cells of the memory array 16.

During the weak-write cycle, the test circuit 12 responds to the microprocessor 80 by causing the address decoder voltage to be sufficiently lowered so that the voltage on the group 26 of word lines is slightly less than the threshold voltage of the memory array 16 so that pattern data is inefficiently coupled into the memory array cells. In this regard, in a weak cell the data will flip, while in a normal or good cell, the data will be unchanged.

SYSTEM OPERATION

Figure 1A:
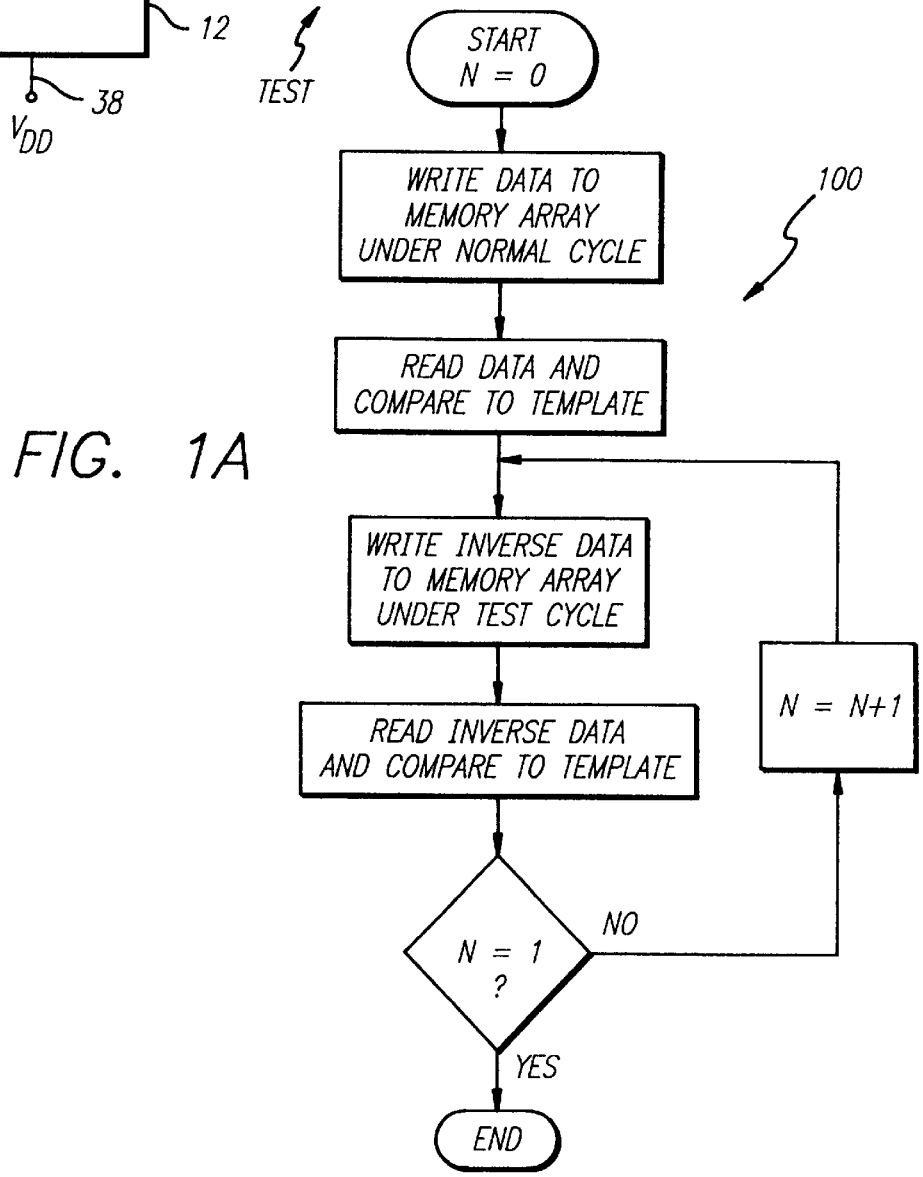
FIG. 1A is a flowchart of a weak-write algorithm in accordance with the present invention.

Referring to FIG. 1A, in operation, a weak-write algorithm 100 stored in the internal memory unit of the microprocessor 80 causes a pattern of data is written to the memory array 16 under control of the microprocessor 80 in a normal write cycle. In this regard, the microprocessor 80 causes a test line 20 to remain at a logical low level, which in turn, causes the weak-write circuit 12 to apply a nominal address decoder voltage level to the address decoder 14.

The pattern that is written into the memory array 16 can be a pattern of all ones, a pattern of all zeros, a checkerboard pattern, or any other pattern that is suitable for testing the memory array 16.

Once the pattern is written into the memory array 16, the microprocessor 80 under control of the weak write algorithm 100 causes a set 74 memory data lines $D_{0-n}$, such as the memory data lines 77–79, to be read and compared with an electronic template 83 displayed on a display unit 82. In this regard, the pattern is read back and compared with the template 83, that in turn will indicated defective cells by corresponding defective images, such as a defective image 85 and 87. The defective images identify defective cells by row and column locations within the memory array 16.

The weak-write algorithm 100 then causes the microprocessor to write an inverse pattern into the memory array 16 while holding the test line 20 at a logical high level. The weak write test circuit 12 responds to the high test signal on line 20 by causing the address decoder voltage on line 36 to be sufficiently lowered so that the voltage levels on the pattern lines 47 and 48 is inefficiently coupled into the memory array cells. In this regard, weak cells will flip data states, while normal or good cells will remain unchanged.

The weak-write algorithm 100 then causes the microprocessor 80 to read the group 74 of the memory data lines that should be indicative of the original pattern so they can again be compared with the template 83. Again defective cells in this case will be flipped and are identified by row and column by defective images, such as the images 83 and 85, displayed on the display unit 82.

This process of write, read, compare is then repeated with inverted data to insure that all of the memory cells in the memory array 16 can hold both states of the binary information.

From the foregoing, it should be understood by those skilled in the art that the weak write test algorithm 100 can be utilized both by memory units with and without self-testing capabilities in a very easy and convenient manner without any substantially modification to standard static memory testing circuits.

Figure 2:
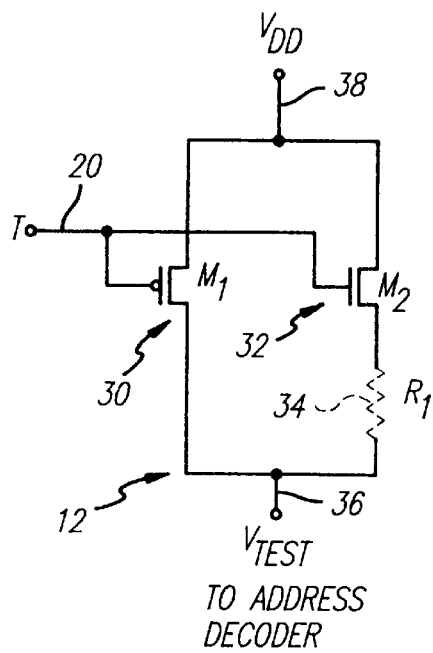
FIG. 2 is a schematic diagram of the weak write test circuit of FIG. 1.

Considering now the weak-write circuit 12 in greater detail with reference to FIGS. 1 and 2, the weak-write circuit generally comprises an p CMOS (M1)device 30 and a n CMOS (M2)device 32 having their respective inputs coupled to the test line 20. As best seen in FIG. 2, the source of the n device 30 is coupled to the drain of the p device and a voltage source $V_{DD}$, which is a sufficient voltage source to raise the word line voltage levels to a sufficient level to effect efficient copying of data into the memory array 16. The drain and source of device 30 and 32 respectively are coupled together via a pull down resistor 34 and form an output node line 36 that carries the address decoder voltage to the address decoder 14.

In operation, when the test line 20 is low or at a logical zero value, the n MOS device 32 is turned off and the pMOS device 30 is turned on so the output voltage applied to the address decoder 14 via the output node line 36 is about $V_{DD}$ volts. Conversely, when the test line 20 is at a high or at a logical one value, the p device 30 is turned off and the n device 32 is turned on so the output voltage applied to the output node line 36 is about $(V_{DD}-V_T)$ volts, which is a sufficient voltage to cause the set 24 of word lines to have voltage values slightly less than the threshold voltage level of the word line transistors in the memory array 16 as will be explained hereinafter in greater detail. In the preferred embodiment, $V_{DD}$ is about 3.3 volts and $(V_{DD}-V_T)$ is between about 2.0 volts and about 2.4 volts, and preferably about 2.3 volts.

Figure 3:
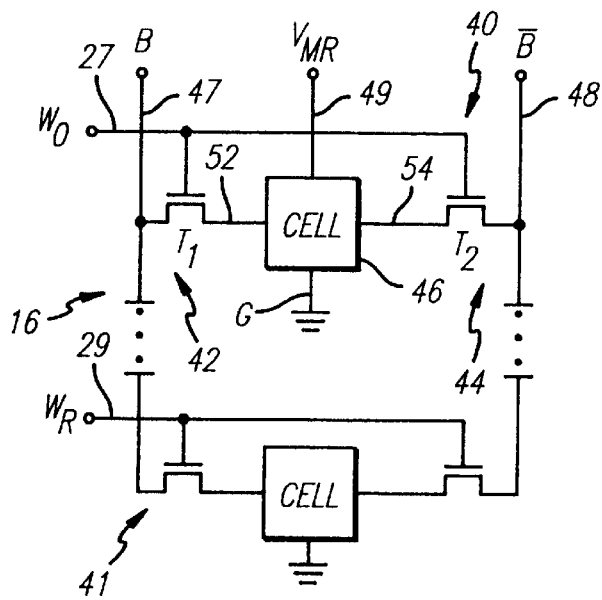
FIG. 3 is a partial schematic diagram of the memory array of FIG. 1.

Considering now the memory array 16 in greater detail with reference to FIG. 3, the memory array 16 is a conventional large static CMOS memory array having an array of memory cells, such as the memory cells 40 and 41 respectively. Each of the memory cells are substantially identical so only memory cell 40 will be described hereinafter in greater detail.

Figure 4:
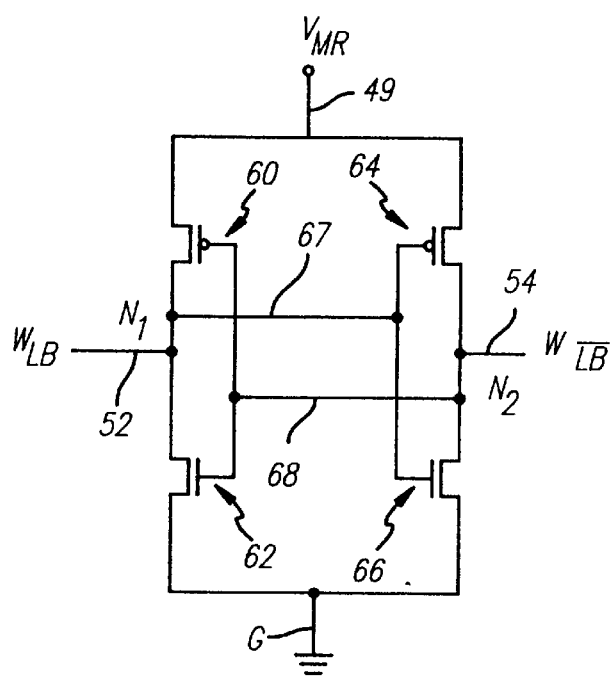
FIG. 4 is a schematic diagram of the memory cell of FIG. 3.

Considering now the memory cell 40 in greater detail with reference to FIGS. 3 and 4, the memory cell 40 is a six-transistor CMOS static memory cell that includes a pair of pass gates or word line n MOS devices 42 and 44 respectively that have their drains coupled to a SRAM static latch circuit 46 that retains data stored therein so long as power is supplied to the memory array 16. The gates of the devices 42 and 44 are coupled to one of the word lines, such as the $W_0$ word line 27, while the source of the respective devices 42 and 44 are coupled to data or bit lines 47 and 48 respectively. The cell 40 is connected between a memory array voltage source $V_{MR}$ via a voltage line 49, and a grounding source (G). The static latch circuit 46 is conventional and includes a pair of p MOS devices 60 and 64 and a pair of n MOS devices 62 and 66. As the latch 46 and the operation of the cell 40 are conventional and well known to those skilled in the art the latch and operation of the cell 40 will not be described hereinafter in greater detail.

Considering now the SRAM cell 46 in greater detail with reference to FIGS. 3 and 4, to invert the cell 46, more current must flow through the pass gates 42 and 44 than that current flowing through the pull-up transistors 60,64 or pull-down transistors 62,66. In a typical 3.3 v technology, a threshold current of about 200 $\mu$ amperes is sufficient for a good cell. One fourth of this current value or about 50 $\mu$, amperes is defined as a good weak write parameter where all good cells will be able to tolerate such leakage without changing states and all bad cells will flip states.

The empirical verification of the gate voltage that is required to cause a weak write current of about 50 $\mu$ amperes is demonstrated by the following sub-threshold leakage current equations:

$$I_D = \mu_n(Z/L)q/(\sqrt{2}\beta)(L_D)(ni^2/N_A)e^{\beta\Psi_s}(1-e^{-\beta V_o})$$
$$(\beta\Psi_s)^{-\frac{1}{2}} = 50 \, \mu A \qquad \text{Equation 1}$$

where:

$\mu_n$=electron mobility=0.15 m²/V·s (Z/L)=pass gate transistor width/length q=electron charge $\beta$=constant=$\frac{1}{26}$ mv at room temperature $L_D$=Debye Length $n_i$=intrinsic electron concentration=$1.45\times10^{10}$ cm$^{-3}$ $N_A$=Acceptor concentration $\Psi_s$=surface potential Simplification is now possible by making the following assumptions:

Z/L=1.5, oxide thickness $t_{ox}$=200 Å

Also: Since $V_D$=3.3 volts>>26 mv, $e^{-\beta V_D} \to 0$ then using $N_A=1\times10^{17}$ cm$^{-3}$ $L_D$=131 Å

Now equation 1 simplifies $$I_o = 1.815\times10^{-20} A \cdot e^{\beta\Psi_s}(\beta\Psi_s) = 50 \, \mu A \qquad \text{Equation 2}$$

or $$e^{\beta\Psi_s}(\beta\Psi_s)^{-\frac{1}{2}} = 2.755\times10^{15}$$

$$\beta\Psi_s - \frac{1}{2}\ln(\beta\Psi_s) = 35.55 \qquad \text{Equation 3}$$

Solving numerically Equation 3: $\Psi_s$=0.4724 V

Now using $\Psi_s$ the gate voltage is found as follows:

$$V_G = \Psi_s + (\sqrt{2\epsilon q N_A \Psi_s})/C_{ox} \qquad \text{Equation 4}$$

where $C_{ox}$=oxide capacitance $e_{ox}/t_{ox}$=0.135 $\mu$f therefore $V_G$=2.3 volts Now referring to FIG. 2, $V_{DD}$=3.3 volts $V_{TEST}$=$V_G$=2.3 volts where $V_{TEST}$ is the power supply voltage applied to the address decoder 14.

In operation then, when the test signal T on line 20 is held at a logic low level, the p-channel device 30 is turned on and the voltage $V_{TEST}$ applied to the address decoder 14 is then equal to $V_{DD}$ or about 3.3 volts. In this regard, the voltage drop across the device 30 is about 0 volts. Conversely, when the test signal T on line 20 is held at a logic high level, the device 32 is turned on and the voltage $V_{TEST}$ applied to the address decoder 14 is then equal to $V_{TEST}$=3.3 V–$V_t$, where $V_t$ is the threshold voltage of device 32. Thus, since a test voltage of about 2.3 volts is required to generate a threshold current of about 50 $\mu$A the device 30 can be configured so that $V_t$ is about 1.0 volts. In this case the resistor 34 can be eliminated at $V_{TEST}$=3.3 v–1.0 v=2.3 volts.

In those cases where $V_t$ can not be configured to provide the necessary voltage drop, the resistor 34 can be added so that $V_{TEST}$=3.3 volts–$V_t$–$I_{DECODE}(R_1)$=2.3 volts where $I_{DECODE}$=the current drawn by the address decoder 14

Completing the numerical analysis $$V_T = 2\Psi\beta + (\sqrt{\epsilon_s q N_A \Psi_\beta})/C_{ox} = 1.0 \text{ volts} \qquad \text{Equation 5}$$

where $\Psi_\beta$=0.026 v In $N_A$/ni at room temperature

Thus, if it is further assumed that the oxide thickness is given as before by $C_{ox}$=0.135 $\mu$f, then solving equation 5 the following is found:

$N_A=7.86\times10^{15}$ cm$^{-3}$

While a particular embodiment of the present invention has been disclosed, it is to be understood that various different modifications are possible and are contemplated within the true spirit and scope of the appended claims. There is no intention, therefore, of limitations to the exact abstract or disclosure herein presented.

I claim:

1. In a static random access memory having at least one memory cell capable of storing either a first value or a second value, the memory cell being coupled to a bit line and a complementary bit line, and a word address line, a test circuit comprising:

a switching device coupled to the word address line for causing the voltage level thereon to be at a sufficient nominal level to enable the bit line and complementary bit line to be efficiently coupled into the memory cell so the memory cell contains the first value during a normal write cycle; and another switching device coupled to the word address line for causing the voltage level thereon to be at a sufficiently low level inefficiently couple the bit line and complementary bit line into the memory cell so during a weak write cycle the memory contains the second value when the cell is defective and retains the first value when the cell is fully functional.

2. A test circuit according to claim 1, wherein said switching device is a CMOS device coupled to a nominal voltage source.

3. A test circuit according to claim 2, wherein said another switching device is another CMOS device coupled between said nominal voltage source and the word address line via a pull-down resistor.

4. A test circuit according to claim 3, wherein said nominal voltage source generates a voltage level between about 2.0 volts and about 2.4 volts (3.3 v technology).

5. A system for testing a static random access memory having at least one memory cell capable of storing either a first value or a second value, the memory cell being coupled to a bit line, a complementary bit line, and a word address line, comprising:

a voltage control circuit coupled to the word address line for causing the voltage level thereon to be at a sufficient nominal level to enable the bit line and the complementary bit line to be efficiently coupled into the memory cell so the memory cell contains the first value during a normal write cycle; and a microprocessor coupled to said voltage control circuit for causing it to decrease the voltage level on the word address line to a sufficiently low level to inefficiently couple the bit line and complementary bit line into the memory cell so the memory cell contains the second value during a weak write cycle when the cell is defective and the first value during said weak write cycle when the cell is fully functional.

6. A system according to claim 5, wherein said voltage control circuit includes:

a switching device coupled to the word address line for causing the voltage level thereon to be at a sufficient nominal level to enable the bit line and complementary bit line to be efficiently coupled into the memory cell so the memory cell contains the first value during a normal write cycle; and another switching device coupled to the word address line for causing the voltage level thereon to be at a sufficiently low level inefficiently couple the bit line and complementary bit line into the memory cell so during a weak write cycle the memory contains the second value when the cell is defective and retains the first value when the cell is fully functional.

7. A system according to claim 6, wherein said switching device is a CMOS device coupled to a nominal voltage source.

8. A system according to claim 7, wherein said another switching device is another CMOS device coupled between said nominal voltage source and the word address line via a pull-down resistor.

9. A system according to claim 8, wherein said nominal voltage source generates a voltage level between about 2.0 volts and about 2.4 volts.

10. A method of testing a static random memory having at least one memory cell capable of storing either a first value or a second value, the memory being coupled to a bit line, a complementary bit line, and a word address line, comprising:

coupling a nominal voltage level to the word line during a normal write cycle, said nominal voltage level being a sufficient level to enable the bit line and the complementary bit line to be efficiently coupled into the memory cell so the memory cell contains the first value during a normal write cycle; and coupling a weak voltage level to the word line during a weak-write cycle, said weak voltage level being a sufficiently low level to inefficiently couple the bit line and complementary bit line into the memory cell so during said weak write cycle so that the memory cell contains the second value when the cell is defective and retains the first value when the cell is fully functional.

* * * * *